United States Patent
Chang et al.

(10) Patent No.: US 12,131,935 B2
(45) Date of Patent: Oct. 29, 2024

(54) ALIGNMENT PLATFORM AND ELECTRONIC COMPONENT TRANSMISSION APPARATUS

(71) Applicant: HON. PRECISION, INC., Taichung (TW)

(72) Inventors: Yuan-Long Chang, Taichung (TW); Ting Wei Chou, Taichung (TW)

(73) Assignee: HON. PRECISION, INC., Taichung (TW)

( * ) Notice: Subject to any disclaimer, the term of this patent is extended or adjusted under 35 U.S.C. 154(b) by 517 days.

(21) Appl. No.: 17/380,180

(22) Filed: Jul. 20, 2021

(65) Prior Publication Data
US 2022/0044954 A1 Feb. 10, 2022

(30) Foreign Application Priority Data
Aug. 7, 2020 (TW) ................. 109126930

(51) Int. Cl.
*H01L 21/68* (2006.01)
*G01R 31/28* (2006.01)
*H01L 21/67* (2006.01)

(52) U.S. Cl.
CPC ........ *H01L 21/681* (2013.01); *G01R 31/2891* (2013.01); *G01R 31/2893* (2013.01); *H01L 21/67271* (2013.01)

(58) Field of Classification Search
CPC ............... G01R 31/28; G01R 31/2808; G01R 31/2867; G01R 31/2891; G01R 31/2893; H01L 21/67; H01L 21/68; H01L 21/67271; H01L 21/681

USPC .................................................... 324/750.16
See application file for complete search history.

(56) References Cited

U.S. PATENT DOCUMENTS

2016/0305508 A1 * 10/2016 Tsai .................. B60K 17/04

FOREIGN PATENT DOCUMENTS

| CN | 103934207 A | * | 7/2014 | ............ B07C 5/00 |
| JP | 2013197559 A | * | 9/2013 | ........... H01L 21/027 |
| JP | 2020101448 A | * | 7/2020 | ............ G01R 31/28 |
| TW | M376556 U1 | | 3/2010 | |

(Continued)

OTHER PUBLICATIONS

English translation JP 2013197559 A Alignment Stage (Year: 2013).*

(Continued)

*Primary Examiner* — Alexander Satanovsky
*Assistant Examiner* — Courtney G McDonnough
(74) *Attorney, Agent, or Firm* — Best & Flanagan LLP

(57) ABSTRACT

The present invention reveals an alignment platform for aligning electronic component precisely to the operation position during testing or hot pressing processes. The alignment platform makes a rotor to rotate by a driving apparatus. The rotor has an eccentric axle to where a connecting member is disposed. The connecting member is moved by the eccentric axle, driving an active plate to move. The eccentric axle, the driving apparatus, the connecting member, and the active plate are configured to move under control in a micro or nano meter scale. Thus, precisely alignment of electronic component can be achieved. Floating mechanism of electronic component transmission apparatus or electronic component handler may be dismissed for lowering cost and prolonging lifetime.

15 Claims, 10 Drawing Sheets

(56) References Cited

FOREIGN PATENT DOCUMENTS

| | | | |
|---|---|---|---|
| TW | I543836 B | 8/2016 |
| TW | I607223 B | 12/2017 |
| TW | I631651 B | 8/2018 |
| TW | I641835 B | 11/2018 |
| TW | I649247 B | 2/2019 |
| TW | I677774 B | 11/2019 |
| TW | I687289 B | 3/2020 |

OTHER PUBLICATIONS

English translation JP 2020101448 A Handler (Year: 2020).*
English translation CN 103934207 A Operation Device of Electronic Element Work Unit, Work Method and Application Thereof (Year: 2014).*

* cited by examiner

ALIGNMENT PLATFORM AND ELECTRONIC COMPONENT TRANSMISSION APPARATUS

FIELD OF THE INVENTION

The present disclosure relates to an alignment platform for moving electronic components for alignment.

BACKGROUND OF THE INVENTION

An electronic component testing and sorting apparatus is used to undergo the test on the electronic component such as the IC chip having solder balls. The sorting apparatus takes the electronic components from the tray to transport them to the testing apparatus. After the test, the sorting apparatus transports the electronic components to the specific positions, such as different trays, according to the test result.

Besides, other processing such as assembling or thermocompression mat be also necessary for the electronic components, as shown in patents TW 1687289, TW 1607223, TW 1649247, and TW 1641835. The thermocompression apparatus is further disclosed in patent TW 1677774.

During the processing mentioned above, the electronic component is picked up and moved to the predetermined position. However, the electronic component becomes extremely tiny and complicated, so the position of the electronic component has to be precise to prevent from misconnection of the junctions.

Patents TW 1631651 and TW 1543836 showed a floating mechanism for the alignment of the electronic component. For example, the first sliding member and the second sliding member of TW 1631651, or the air bladder and the movable member of TW 1543836, may make the electronic component float and move to the right position with the guiding rod or the guiding groove, such as the driving member and the connecting member of TW 1631651 or the connecting portion and the matching portion of TW 1543836.

The apparatus mentioned above can move the electronic component to the right position. However, the force exerted on the electronic component is increased during testing or thermocompression because the electronic component has more junctions today. The air bladder, the sliding member, and the guiding rod may be abraded due to the pressure, the sliding, and the deformation during every process.

The present invention is, therefore, arisen to obviate or at least mitigate the above mentioned disadvantages.

SUMMARY OF THE INVENTION

One of the objects of the present invention is to provide an alignment device of electronic components which is more durable.

To achieve the above and other objects, the alignment platform of the present invention includes a stationary plate, an active plate, at least one rotation member, at least one driving apparatus, and at least one connecting member. The driving apparatus is disposed on the stationary plate. The rotation member has an axis for rotation and an eccentric axle. The driving apparatus is adapted for driving the rotation member to rotate around the axis to make the eccentric axle rotate around the axis. The connecting member has a first connecting portion and a second connecting portion. The first connecting portion is connected to the active plate to make the active plate move following the first connecting portion. The second connecting portion is pivotally connected to the eccentric axle.

In some embodiments, the first connecting portion is pivotally connected to the active plate.

In some embodiments, the driving apparatus includes a motor and a reducer. The reducer is connected to the motor and the rotation member therebetween so that the motor drives the rotation member to rotate via the reducer. Specifically, the reducer is embedded in the stationary plate.

In some embodiments, the active plate has at least one groove, and the connecting member is movably received in the groove.

In some embodiments, the active plate has a terminal face adjacent to the stationary plate to abut against the stationary plate when being pressed.

In some embodiments, the alignment platform further includes a fixation member and a plane bearing. The active plate has a stepped portion. The plane bearing is sandwiched between the fixation member and the stepped portion. The fixation member has an extension portion. The extension portion is fixed on the stationary plate.

In some embodiments, the alignment platform includes a plurality of said driving apparatuses, a plurality of said rotation members, and a plurality of said connecting members. The driving apparatuses are disposed on the stationary plate respectively. The driving apparatuses are connected to the rotation members respectively so that each of the driving apparatuses is adapted for driving one of the rotation members to rotate. The rotation members are connected to the connecting members respectively so that each of the rotation members is adapted for driving one of the connecting members to move. The connecting members are arranged along an intermediary plane. The connecting members are driven by the driving apparatuses to move along the intermediary plane.

To achieve the above and other objects, an electronic component transmission apparatus is also provided. The electronic component transmission apparatus includes the alignment platform mentioned above and further includes a base plate, a storing device, a transmission device, and a holder. Thea base plate has a working area. The working area is adapted for an electronic component working apparatus to work on an electronic component. The storing device is disposed on the base plate for storing the electronic component. The transmission device transports the electronic component between the storing device and the working area. The holder is arranged at the working area. The holder is adapted for positioning the electronic component when the electronic component working apparatus is working on an electronic component. The alignment platform is disposed on at least one of the base plate, the storing device, the transmission device, and the holder in order to move the electronic component for alignment.

Thereby, the alignment platform of the present invention can be utilized in the electronic component transmission apparatus to align the electronic component. Thus, the components in the floating mechanism can be omitted. As a result, the present invention is advantageous in low maintenance cost, low manufacturing cost, higher precision of alignment, thinner structure, longer life-time, and longer maintenance period.

The present invention will become more obvious from the following description when taken in connection with the accompanying drawings, which show, for purpose of illustrations only, the preferred embodiment(s) in accordance with the present invention.

BRIEF DESCRIPTION OF THE DRAWINGS

The present disclosure can be more fully understood by reading the following detailed description of the embodiment, with reference made to the accompanying drawings as follows.

DETAILED DESCRIPTION OF THE PREFERRED EMBODIMENTS

Figure 1:
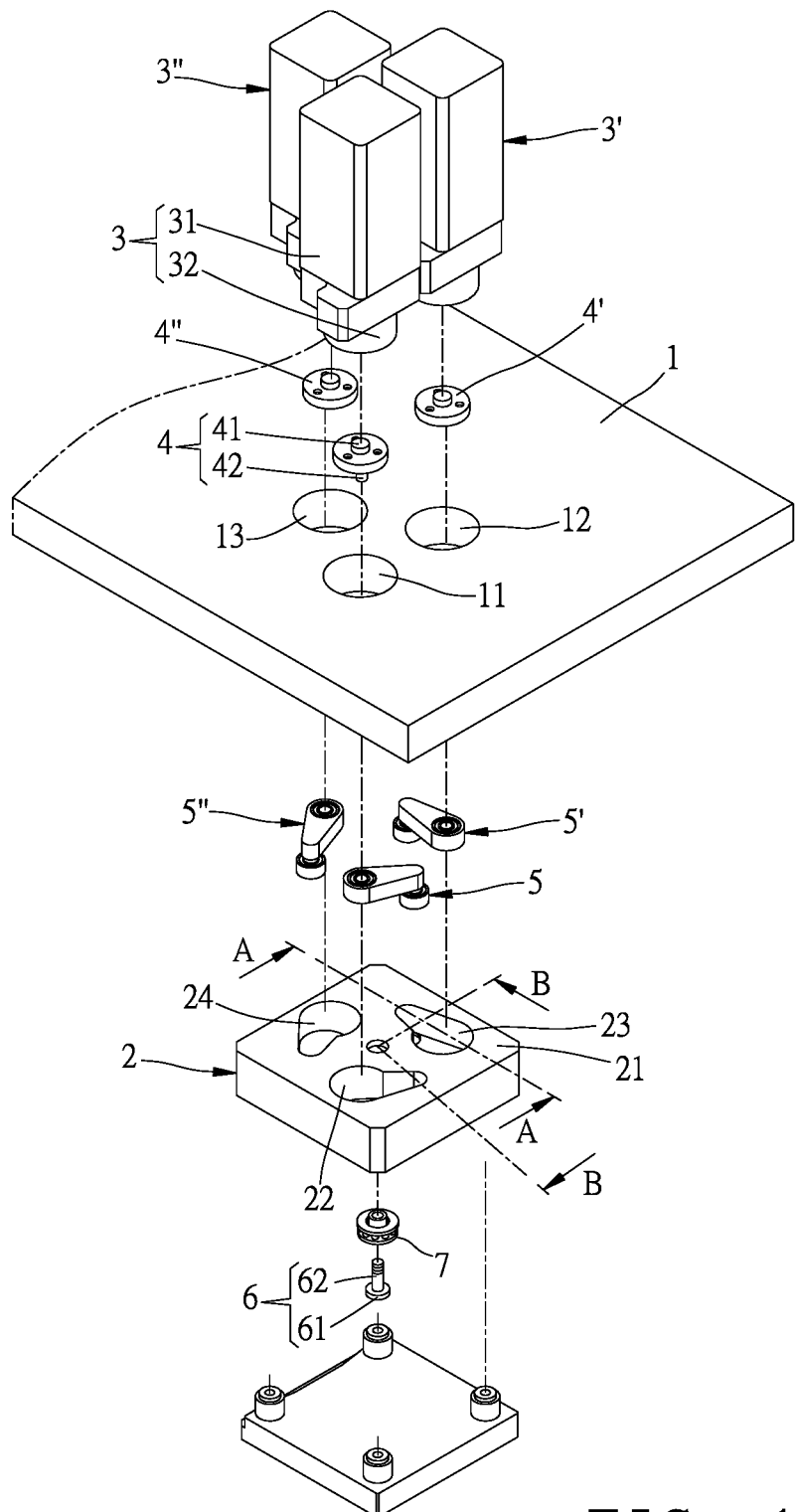
FIG. 1 is a breakdown drawing showing an alignment platform of the present invention.

Please refer to FIG. 1, the present invention provides an alignment platform including a stationary plate 1, an active plate 2, three driving apparatuses 3, 3', 3", three rotation members 4, 4', 4", three connecting members 5, 5', 5", a fixation member 6, and a plane bearing 7.

The stationary plate 1 is a flat plate for other components to disposed thereon. However, the stationary plate can be other shapes too. The stationary plate 1 has three receiving rooms 11, 12, 13. Each of the receiving room extends to connect the top face and the bottom face of the stationary plate 1.

Figure 2:
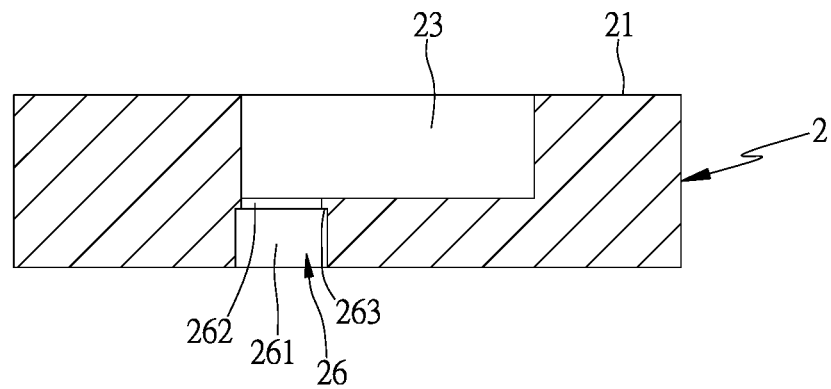
FIG. 2 is an A-A profile of FIG. 1.
Figure 3:
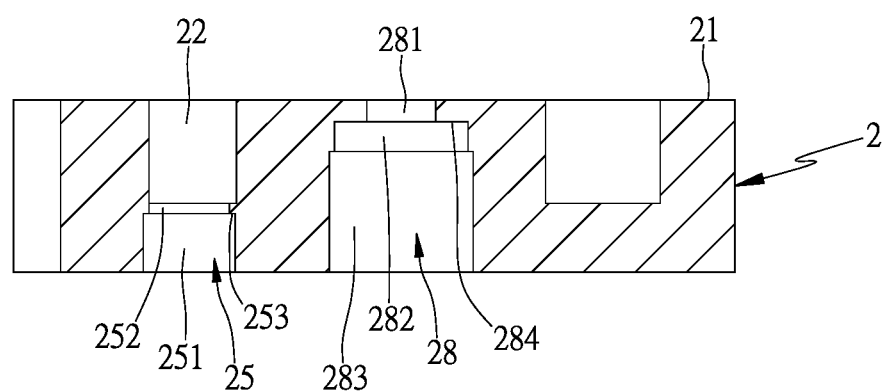
FIG. 3 is a B-B profile of FIG. 1.

The active plate 2 is also a flat plate and is parallel to the stationary plate 1. Similarly to the stationary plate, the active plate can be other shapes too. The top terminal face 21 is adjacent to the stationary plate 1. Please refer to FIG. 1 to FIG. 3, the active plate 2 has three grooves 22, 23, 24. Each of the grooves is recessedly formed on the top terminal face of the active plate 2. The active plate 2 further has three extension holes recessedly formed on the bottom terminal face of the active plate 2. The extension holes have the identical shape and structure, as shown in FIG. 1 to FIG. 3 for the extension holes 25, 26. As shown in FIG. 3, the extension hole 25 has a wide section 251 and a narrow section 252. The wide section 251 extends upward from the bottom terminal face of the active plate 2. The narrow section 252 is connected to the wide section 251 and one of the grooves 22 therebeween. A stepped face 253 is formed between the wide section 251 and the narrow section 252. The active plate 2 further has a support hole 28. The support hole 28 includes a first section 281, a second section 283, and a third section 283. The first section 281 and the third section 283 are formed on the top terminal face 21 and the bottom terminal face of the active plate 2 respectively. The second section 282 is connected to the first section 281 and the third section 283 therebetween. The second section 282 has an inner diameter larger than the inner diameter of the first section 281 so that a stepped portion 284 is formed between the first section 282 and the second section 282. The third section 283 has an inner diameter larger than the inner diameter of the second section 282.

Each of the three driving apparatuses 3, 3', 3" is connected to one of the three rotation members 4, 4', 4" respectively. Each of the three rotation members 4, 4', 4" is connected to one of the three connecting members 5, 5', 5" respectively. That is, each set of the driving apparatus, the rotation member, and the connecting member has the same or the similar structure. In the present embodiment, the three sets of the driving apparatus, the rotation member, and the connecting member are adapted for moving the active plate along the X-axis, the Y-axis, and to rotating the active plate at an angle θ. However, the number of sets of the driving apparatus, the rotation member, and the connecting member can be alternated according to the needs of movement of the active plate. Also, the sliding track or the pivot axle can be introduced to help the active plate move.

Figure 4:
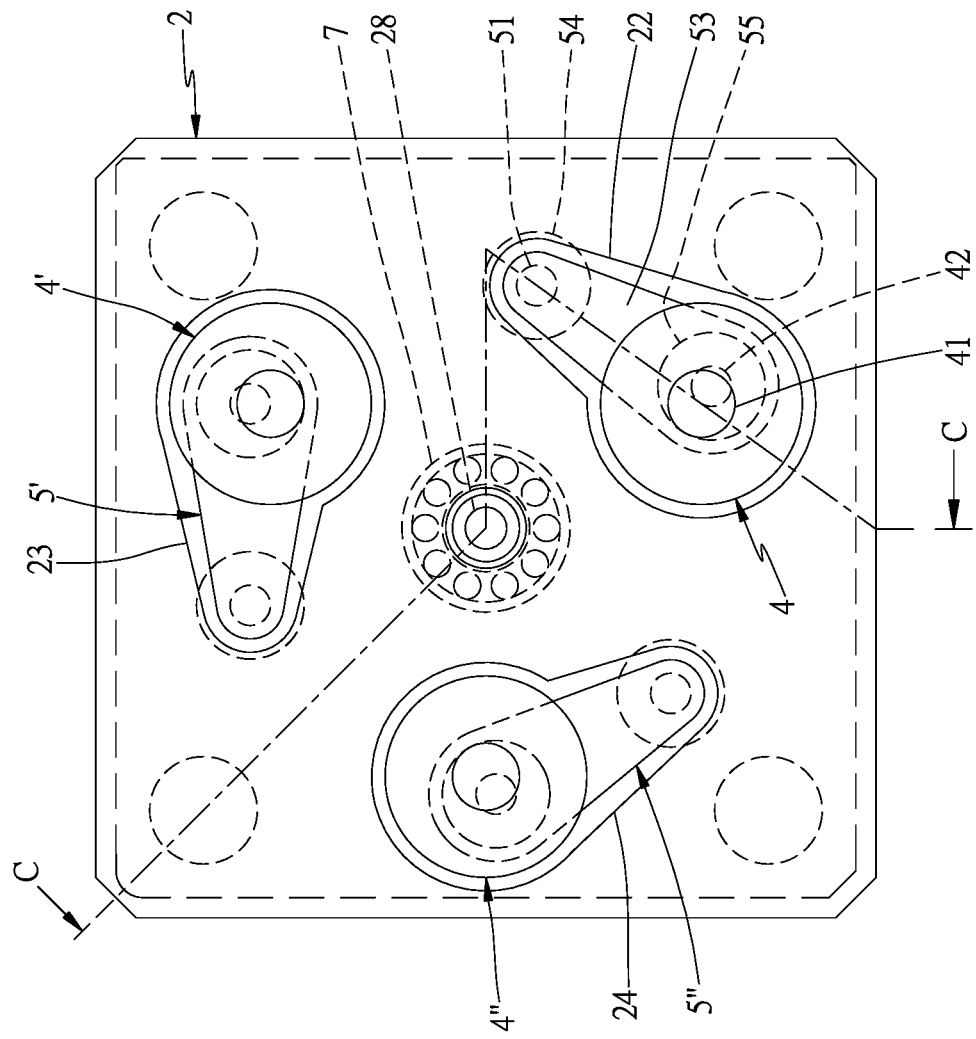
FIG. 4 is a perspective view showing an active plate of the present invention.
Figure 5:
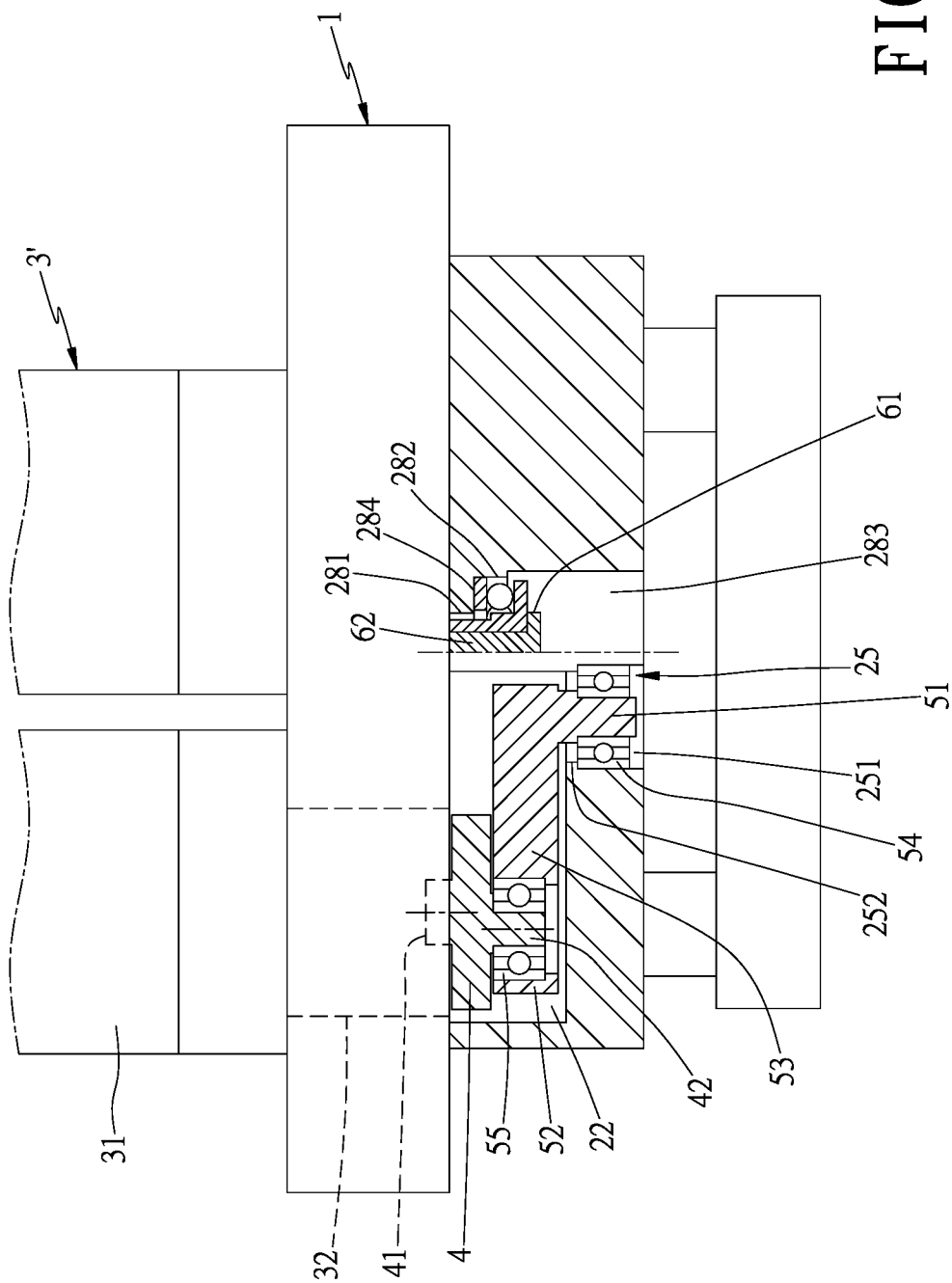
FIG. 5 is a C-C profile of FIG. 4.

Please refer to FIG. 1, FIG. 4, and FIG. 5, the driving apparatus 3 includes a motor 31 and a reducer 32. The motor 31 is connected to the reducer 32. The reducer 32 is fixedly embedded in the stationary plate 1 to be received in the receiving room 11 of the stationary plate 1 so that the driving device 3 is fixed on the stationary plate 1. Thus, the volume of alignment platform can be reduced. Preferably, the reducer 32 has a larger reduction ratio and zero backlash. The motor 31 can be an electromagnetic motor, such as a servomotor or a stepper motor, or an ultrasonic motor driven by piezo elements.

The rotation member 4 is received in the groove 22 and has a rotation axle 41 and an eccentric axle 42. The rotation axle 41 is connected to the reducer 32. An axis is defined by an extension direction of the rotation axle 41. The motor 31 drives the rotation member 4 to rotate around the axis via the reducer 32 so that the rotation member 4 is rotatable around the axis with respect to the stationary plate 1. The rotation axle 41 and the eccentric axle 42 is parallel staggered. When the rotation member 4 rotates, the eccentric axle 42 also rotates around the axis.

The connecting member 5 is received in the groove 22 and is movable in the groove 22. The connecting member 5 has a first connecting portion 51, a second connecting portion 52, and a connecting arm 53 therebetween. The first connecting portion 51 is an axle extending downward to be pivotally connected to the active plate 2. Specifically, the connecting member 5 further includes a bearing 54 which is embedded in the active plate 2 and is received in the wide section 251 of the extension hole 25. The first connecting portion 51 extends downward through the narrow section 252 from the groove 22 to insert into the bearing 54 so that the first connecting portion is pivotable with respect to the active plate 2. The second connecting portion 52 has an axial hole to pivotally connected to the eccentric axle 42. Specifically, the connecting member 5 further includes a bearing 55 which is embedded in the second connecting portion 52 and is received in the axial hole of the second connecting portion 52. The eccentric axle 42 is inserted into the bearing 55 so that the second connecting portion 52 is pivotable with respect to the rotation member. In the present embodiment, the first connecting portion 51 is rod-shaped, the active plate 2 has the corresponding extension hole, the second connecting portion 52 has the axial hole, and the eccentric axle 42 is also rod-shaped. However, it is possible that the axial hole is formed on the first connecting portion, and that the active plate is formed with the axial rod. Also, it is possible that the second connecting portion is rod-shaped, and the eccentric axle has the corresponding axial hole. Besides, the bearings 54, 55 are ball bearings in the present embodiment. However, the bearings can be other types of bearing, or omitted.

Please refer to FIG. 1 and FIG. 5, each of the connecting member 5, 5', 5" is connected to the reducer and the active plate 2 therebetween and is received in the groove of the active plate. When observed laterally, the connecting members 5, 5', 5" are aligned along an intermediary plane and are movable or pivotable along the intermediary plane. The intermediary plane is parallel to the stationary plate 1 and the active plate 2, and is perpendicular to the rotation axle 41, the eccentric axle 42, and the first connecting portion 51.

The fixation member 6 can be a bolt to have a head portion 61 in larger diameter and an extension portion 62 in smaller diameter. The extension portion 62 is threaded and extends upward from the head portion 61.

The plane bearing 7 has a through hole and is received in the second section 282 of the support hole. The fixation member 6 abuts against the plane bearing 7 so that the plane bearing 7 is sandwiched between the stepped portion 284 and the head portion 61. The extension portion 62 of the fixation member penetrates the through hole of the plane bearing 7 to be fixed onto the stationary plate 2 upward by screwing, for example. Preferably, the lateral face of the plane bearing 7 abuts against the inner wall of the second section 282. The longitudinal length of the plane bearing 7 is larger than the length of the second section 282 so that the plane bearing 7 is protruded partially to be received in the third section 283.

Figure 6:
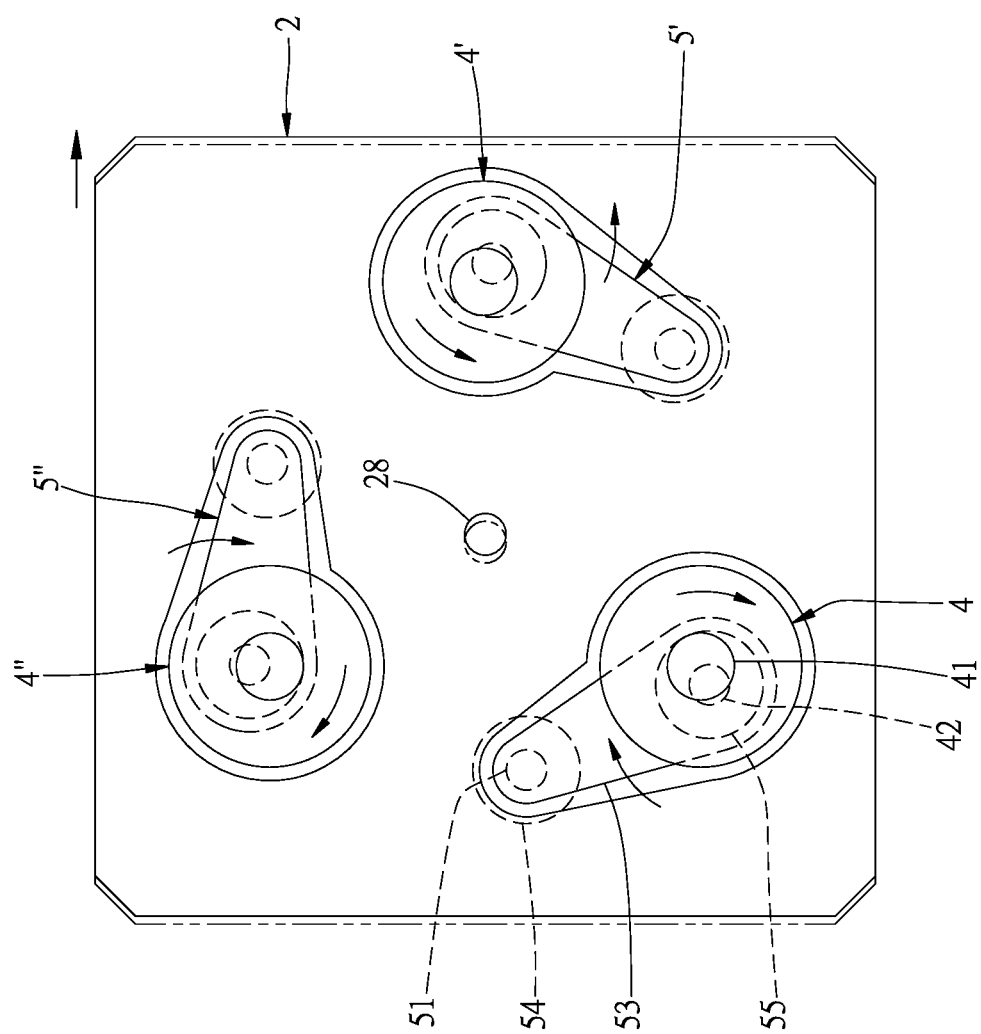
FIG. 6 to FIG. 8 are illustration showing a movement of an active plate of the present invention.
Figure 7:
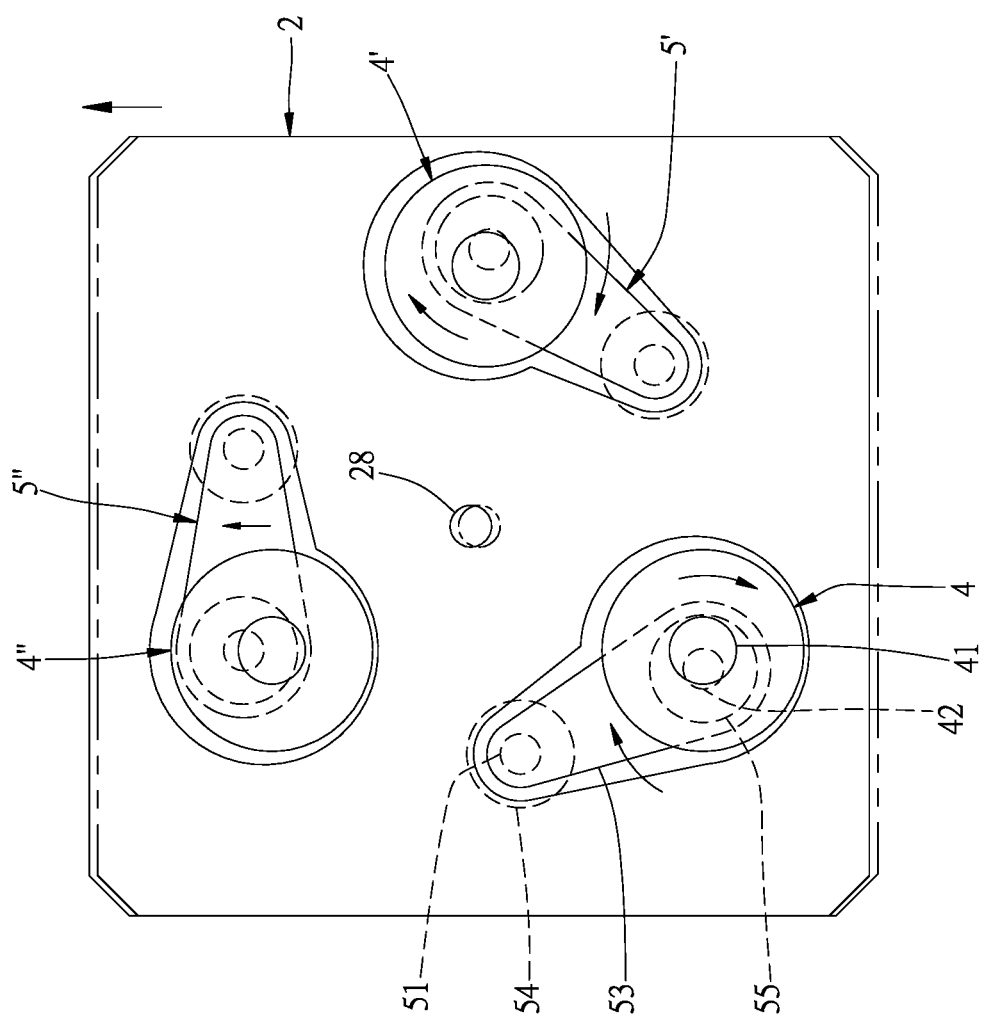
Figure 8:
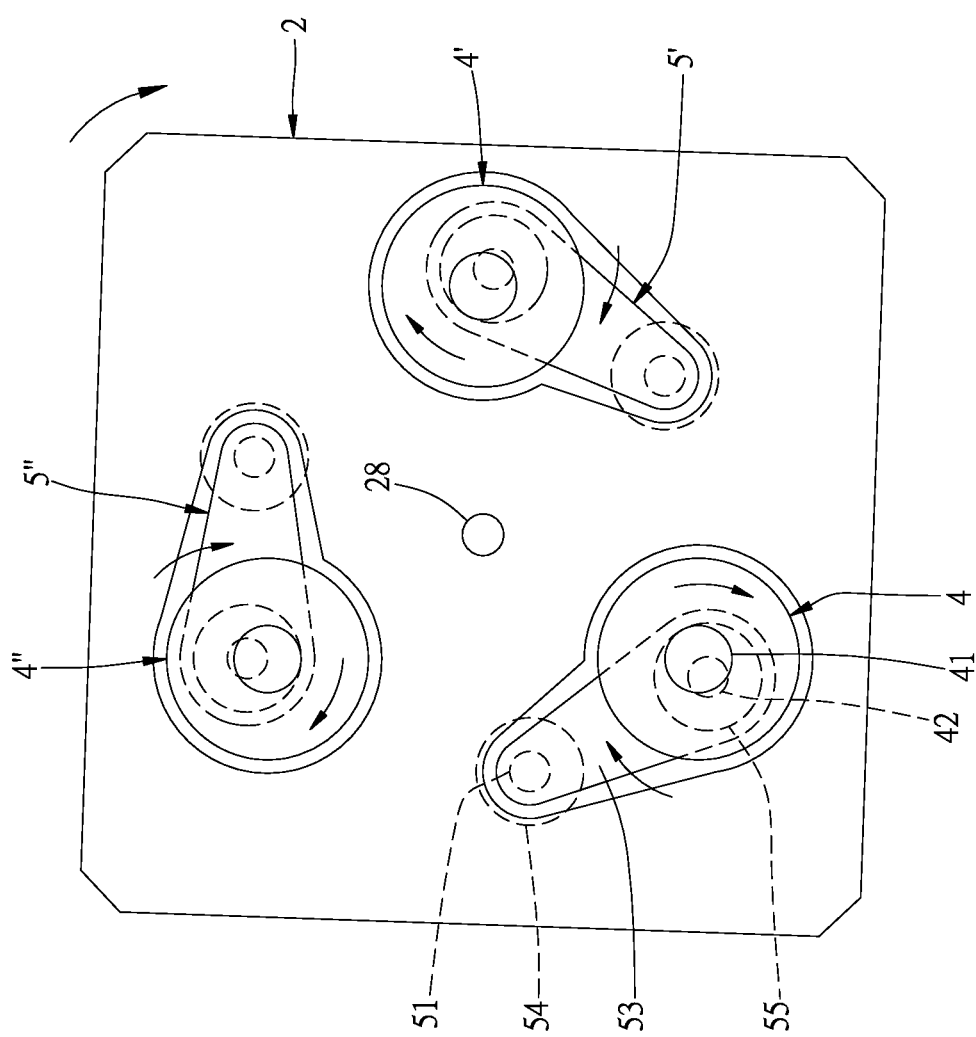

Please refer to FIG. 6 to FIG. 8, the three driving apparatuses 3, 3', 3" drive the three rotation members 4, 4', 4" to rotate respectively to move the three connecting members 5, 5', 5" to move respectively. The three connecting members 5, 5', 5" are pivotally disposed on the active plate 2 to drive the active plate to move while pivoting. For example, the active plate 2 can be moved along the X-direction as shown in FIG. 6, along the Y-direction as shown in FIG. 7, or the active plate 2 can rotate without movement as shown in FIG. 8. Thereby, the active plate can be moved at any direction in a plane.

Figure 9:
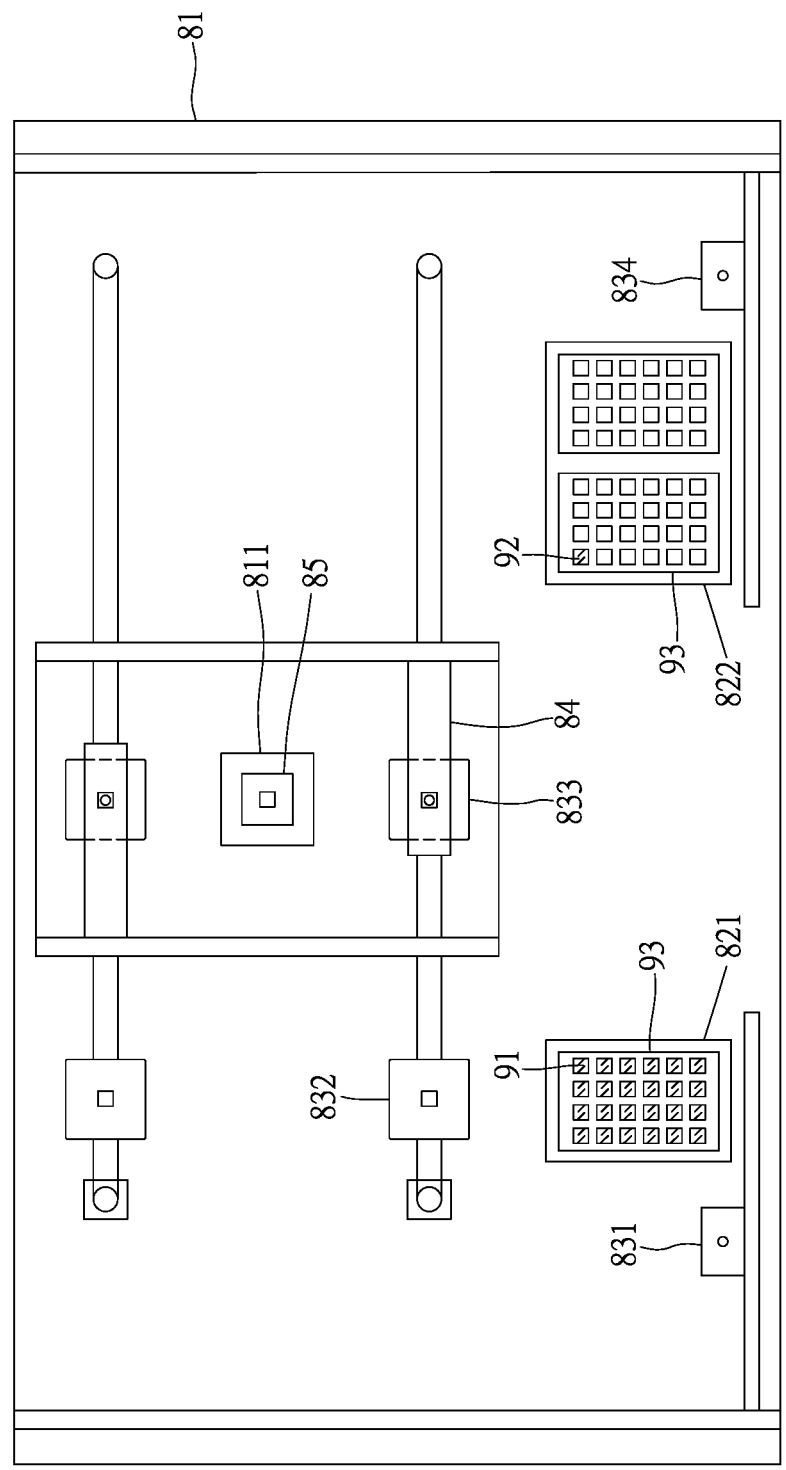
FIG. 9 is an illustration showing an electronic component transmission apparatus of the present invention.

The alignment platform of the present invention can be installed in a holder, a transmission device, or a storing device of the electronic component transmission apparatus. As shown in FIG. 9, the electronic component transmission apparatus can be a sorting machine of the electronic component testing apparatus, including a base plate 81, a storing device, a transmission device, and a holder 84, to cooperate with the electronic component working apparatus 85, such as the testing device of the electronic component testing apparatus. Specifically, the base plate 81 has a working area 811 for receiving the electronic component. The electronic component working apparatus 85 can be arranged below or above the working area 811 to work on the electronic component at the working area 811 for the electrical tests. The storing device is disposed on the base plate 81 and includes an input device 821 and an output device 822 for receiving the electronic components to be processed and processed the electrical components 91, 92, or the trays 93 for receiving the electronic components. The transmission device includes an input arm 831, an input platform 832, an output platform 833, and an output arm 834. The input arm 831 picks up the electronic component to be processed 91 from the input device 821 and moves it to place it on the input platform 832. The input platform 832 transports the electronic component to a position beside the working area 811, and the holder 84 picks up the electronic component and moves it to the working area for processing. After processing, the holder 84 moves to the position beside the working area 811 again, and the output platform 833 receives the electronic component from the holder 84 to transport it away from the working area 811. The output arm 834 picks up the processed electronic component 92 from the output platform and moves it to a specific position of the output device 822 according to the test result.

Figure 10:
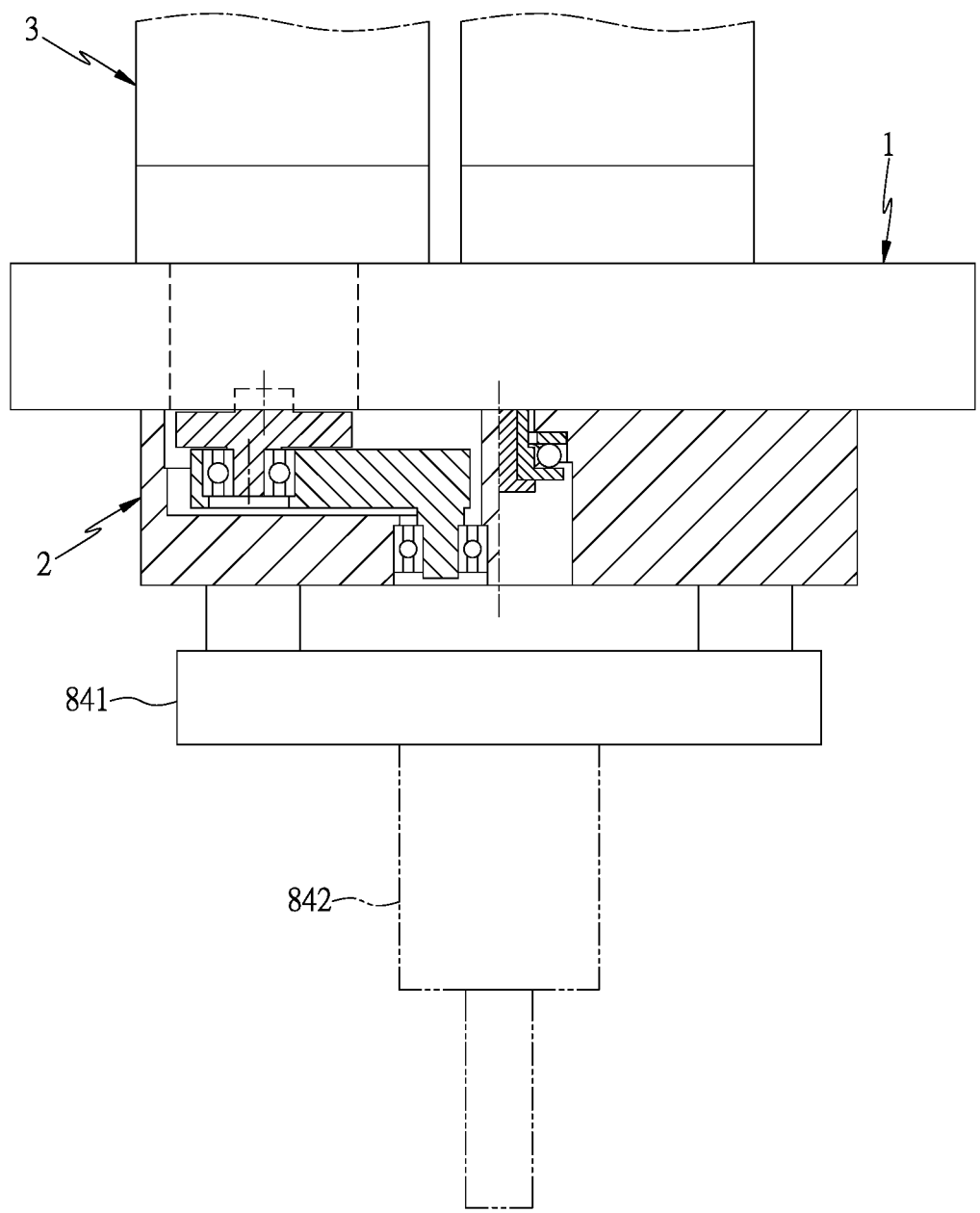
FIG. 10 and FIG. 11 are illustrations showing an alignment platform installed on an electronic component transmission apparatus of the present invention.
Figure 11:
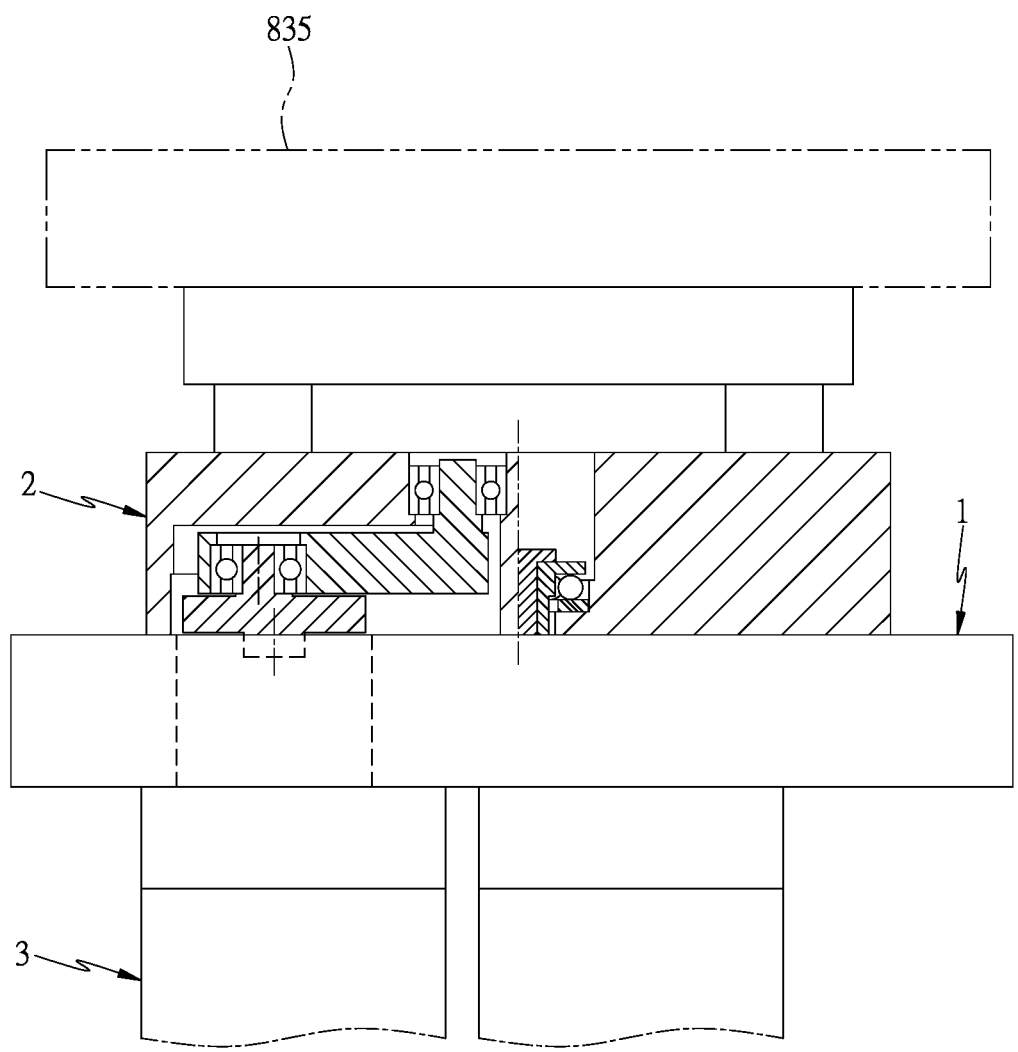

The alignment platform can be used in the holder 84, as shown in FIG. 9 and FIG. 10. The stationary plate 1 or the driving apparatus 3 are disposed on the tracks along the horizontal direction and the longitudinal direction, and the base seat 841 is arranged below the active plate 2. The jig 842 for picking up and pressing the electronic component is arranged below the base seat 841. When the holder moves to the working area with the electronic component, the sensor or the camera disposed on the holder or other members can used to observe the position of the electronic component. Thereafter, the alignment platform drives the active plate to move, and the base seat 841 and the electronic component below the jig 842 are also driven to move for alignment. When the electronic component is positioned, the electronic component is further driven to descend to press the electronic component working apparatus. Besides, the alignment platform can be used in the input platform 832, as shown in FIG. 9 and FIG. 11. The alignment platform is flipped reversely to make the active plate 2 locate above the stationary plate 1, and the stationary plate 1 or the driving apparatus 3 is disposed on the track along the horizontal direction. The base seat or/and the jig 835 supporting the electronic component are arranged above the active plate 2. The position of the electronic component can be monitored by the sensor or the camera on the input platform or other members before the holder 84 picks up the electronic component from the input platform 832 in order to move the electronic component for alignment in advance. Thus, the holder 84 may pick up the electronic component which has been positioned for processing.

In other embodiments, the input device 821 and the input arm 831 can also receive the electronic component or drive the electronic component to move. The alignment platform can be arranged on the input device or the input arm for direct or indirect alignment.

In the embodiment mentioned above, the connecting arm between the first connecting portion and the second connecting portion of the connecting member is rigid. The first connecting portion is pivotally disposed on the active plate. In other possible embodiments, the connecting arm can be a resilient member such as leaf spring. The first connecting portion can be fixed on the active plate. The active plate is movable due to the deformation of the connecting arm to achieve the similar performance.

In the embodiment mentioned above, the rotation member is connected to the reducer of the driving apparatus, and the rotation member is driven to rotate by the motor and the reducer of the driving apparatus. In other possible embodiments, the rotation member can be rotatably disposed on the stationary plate, and the rotation member is driven to rotate by piezo element, ultrasonic motor, or belt pulley assembly to achieve the similar performance.

Thereby, the electronic component transmission apparatus can move the electronic component to help the processing by the electronic component working apparatus. The electronic component can be precisely aligned when transported. Thus, the misconnection of junctions due to the deviation of position can be avoided.

Besides, the reducer can be embedded in the stationary plate, and the rotation member and the connecting member can be received in the groove of the active plate so that the size of the alignment platform can be minimized and become thinner. Thus, the thinner alignment platform makes mechanical design and assembling easier.

The active plate is driven to move by the motor, the reducer, the rotation member, and the connecting member. By adjusting the resolution of the motor, the reduction ratio of the reducer, the eccentric distance of the eccentric axle, and the length of the connecting member, the movement of the active plate in centimeters can provide the micrometer class or nanometer class precision.

Besides, the sliding member, the air bladder, the guiding rod, and the guiding groove in the floating mechanism can be omitted because the electronic member is precisely positioned by the alignment platform after the sensor or the camera monitors the position of the electronic component. Thereby, the cost of manufacturing is reduced, and the cost of maintenance is also reduced because of the less components. Also, the labor cost is reduced, and the utilization rate is improved.

Furthermore, the active plate is adjacent to the stationary plate by its top end, so the rotation member, the connecting member, and the plane bearing are protected by the active plate when a vertical force is exerted. Thus, the components inside are more durable. Besides, when the alignment platform is disposed on the holder, the components in the active plate is protected even if the electronic component is pressed downward by the holder. Thus, the structure is stable, and the components are more durable too.

In conclusion, the alignment platform of the present invention can move the electronic component for alignment, is thinner, smaller, and has a higher precision. In addition, the components in the floating mechanism can be omitted. Furthermore, the present invention is more durable.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An alignment platform comprising:
   a stationary plate;
   an active plate;
   at least one rotation member, rotatable with respect to the stationary plate around an axis, the rotation member having an eccentric axle;
   at least one driving apparatus, adapted for driving the rotation member to rotate to make the eccentric axle rotate around the axis; and
   at least one connecting member, the connecting member having a first connecting portion and a second connecting portion formed integrally with the first connecting portion, the first connecting portion being connected to the active plate to make the active plate move following the first connecting portion, and the second connecting portion being pivotally connected to the eccentric axle;
   wherein the active plate has a terminal face, the terminal face is adjacent to the stationary plate and abuts against the stationary plate when being pressed.

2. The alignment platform of claim 1, wherein the first connecting portion of the connecting member is pivotally connected to the active plate.

3. The alignment platform of claim 1, wherein the driving apparatus comprises a motor and a reducer, the reducer is arranged between the motor and the rotation member for connection so that the motor is adapted for driving the rotation member to rotate via the reducer.

4. The alignment platform of claim 3, wherein the reducer is embedded in the stationary plate.

5. The alignment platform of claim 1, wherein the active plate has at least one groove, the connecting member is movably received in the groove.

6. The alignment platform of claim 1, further comprising a fixation member and a plane bearing, the active plate having a stepped portion, the plane bearing being sandwiched between the fixation member and the stepped portion, the fixation member having an extension portion, the extension portion being fixed on the stationary plate.

7. The alignment platform of claim 1, further comprising:
   a plurality of said driving apparatuses, a plurality of said rotation members, and a plurality of said connecting members, the driving apparatuses are disposed on the stationary plate respectively, the driving apparatuses are connected to the rotation members respectively so that each of the driving apparatuses is adapted for driving one of the rotation members to rotate, the rotation members are connected to the connecting members respectively so that each of the rotation members is adapted for driving one of the connecting members to move, the connecting members are arranged along an intermediary plane, the connecting members are driven by the driving apparatuses to move along the intermediary plane.

8. An electronic component transmission apparatus, including the alignment platform of claim 1, and further comprising:
   a base plate, having a working area, the working area being adapted for an electronic component working apparatus to work on an electronic component;
   a storing device, disposed on the base plate, the storing device adapted for storing the electronic component;
   a transmission device, the transmission device transporting the electronic component between the storing device and the working area;
   a holder, arranged at the working area, the holder being adapted for positioning the electronic component when the electronic component working apparatus is working on an electronic component; and
   wherein the alignment platform is disposed on at least one of the base plate, the storing device, the transmission device, and the holder in order to move the electronic component for alignment.

9. The electronic component transmission apparatus of claim 8, wherein the first connecting portion of the connecting member is pivotally connected to the active plate.

10. The electronic component transmission apparatus of claim 8, wherein the driving apparatus comprises a motor and a reducer, the reducer is arranged between the motor and the rotation member for connection so that the motor is adapted for driving the rotation member to rotate via the reducer.

11. The electronic component transmission apparatus of claim 10, wherein the reducer is embedded in the stationary plate.

12. The electronic component transmission apparatus of claim 8, wherein the active plate has at least one groove, the connecting member is movably received in the groove.

13. The electronic component transmission apparatus of claim 8, wherein the active plate has a terminal face, the terminal face is adjacent to the stationary plate to abut against the stationary plate when being pressed.

14. The electronic component transmission apparatus of claim 8, wherein the alignment platform further comprises a fixation member and a plane bearing, the active plate has a stepped portion, the plane bearing is sandwiched between the fixation member and the stepped portion, the fixation member has an extension portion, the extension portion is fixed on the stationary plate.

15. An electronic component transmission apparatus, comprising the alignment platform of claim 7, and further comprising:
- a base plate, having a working area, the working area being adapted for an electronic component working apparatus to work on an electronic component;
- a storing device, disposed on the base plate, the storing device adapted for storing the electronic component;
- a transmission device, disposed on the base plate, the transmission device transporting the electronic component between the storing device and the working area;
- a holder, arranged at the working area, the holder being adapted for positioning the electronic component when the electronic component working apparatus is working on an electronic component; and
- wherein the alignment platform is disposed on at least one of the storing device, the transmission device, and the holder in order to move the electronic component for alignment.

* * * * *